United States Patent
Pupkiewicz et al.

(10) Patent No.: US 6,227,901 B1
(45) Date of Patent: May 8, 2001

(54) MOTOR BOOT FOR A CIRCUIT BOARD

(75) Inventors: Edward J. Pupkiewicz, Norristown; Bohdan P. Wozniak, Warrington, both of PA (US)

(73) Assignee: Thomas & Betts International, Inc., Sparks, NV (US)

(*) Notice: Subject to any disclaimer, the term of this patent is extended or adjusted under 35 U.S.C. 154(b) by 0 days.

(21) Appl. No.: 09/113,884

(22) Filed: Jul. 10, 1998

(51) Int. Cl.⁷ .................................................. H01R 3/00
(52) U.S. Cl. ............................................................ 439/500
(58) Field of Search ........................ 439/500, 66, 91, 439/701

(56) References Cited

U.S. PATENT DOCUMENTS

| | | | |
|---|---|---|---|
| 4,633,110 | * 12/1986 | Genco et al. | 310/71 |
| 4,910,415 | 3/1990 | Yoshimura | 307/147 |
| 4,927,368 | 5/1990 | Shino | 439/66 |
| 4,932,883 | 6/1990 | Hsia et al. | 439/66 |
| 5,023,498 | * 6/1991 | Abe | 310/71 |
| 5,292,259 | 3/1994 | Sheldrake et al. | 439/353 |
| 5,319,864 | * 6/1994 | Amonett | 34/528 |
| 5,380,212 | 1/1995 | Smeenge, Jr. et al. | 439/86 |
| 5,482,473 | 1/1996 | Lord et al. | 439/67 |
| 5,504,940 | 4/1996 | Hahs, Jr. et al. | 455/38.1 |
| 5,558,804 | 9/1996 | Doss-Desouza | 248/634 |
| 5,599,193 | 2/1997 | Crotzer | 439/66 |
| 5,657,205 | 8/1997 | Tamaru et al. . | |
| 5,686,874 | 11/1997 | Piirainen | 333/234 |
| 5,707,249 | * 1/1998 | Byrd | 439/500 |
| 5,735,697 | * 4/1998 | Muzslay | 439/83 |
| 5,749,737 | * 5/1998 | Zuin | 439/500 |
| 5,769,382 | 6/1998 | Kobayashi et al. . | |
| 5,769,657 | * 6/1998 | Kondo et al. | 439/500 |
| 5,804,895 | * 9/1998 | Tsuzaki et al. | 310/40 |
| 5,875,562 | * 3/1999 | Fogarty | 34/97 |
| 5,879,199 | * 3/1999 | Belopolsky | 439/701 |
| 5,898,248 | 4/1999 | Ikeda et al. . | |
| 5,898,364 | 4/1999 | Gotou . | |

FOREIGN PATENT DOCUMENTS

| | | | |
|---|---|---|---|
| 0 817 551 A1 | 6/1997 | (EP) | H05K/3/30 |
| 08-261431 | 9/1996 | (JP) | H02K/5/22 |

* cited by examiner

Primary Examiner—P. Bradley
Assistant Examiner—Briggitte R. Hammond
(74) Attorney, Agent, or Firm—Hoffmann & Baron, LLP

(57) ABSTRACT

The present invention provides a motor boot for mechanically and electrically connecting a motor to a circuit board and includes a vibrational damping housing constructed of elastomeric material. The housing has a slot formed therein and a receptacle for slidably receiving and releasably securing the motor therein by interference fit. The receptacle includes a cut-out in fluid flow communication with the slot for receiving the electrical pad of the motor. A vibrational damping connector disposed in the slot and contacts the pad of the motor thereby creating electrical communication between the motor and circuit board. The connector is constructed of an electrically conductive elastomeric material, absorbs mechanical energy of the motor, transfers electrical energy of the motor to the circuit board. The connector is integrally formed with the housing thereby making the motor boot of one piece construction or is slidably received and releasably secured within the slot by interference fit.

15 Claims, 2 Drawing Sheets

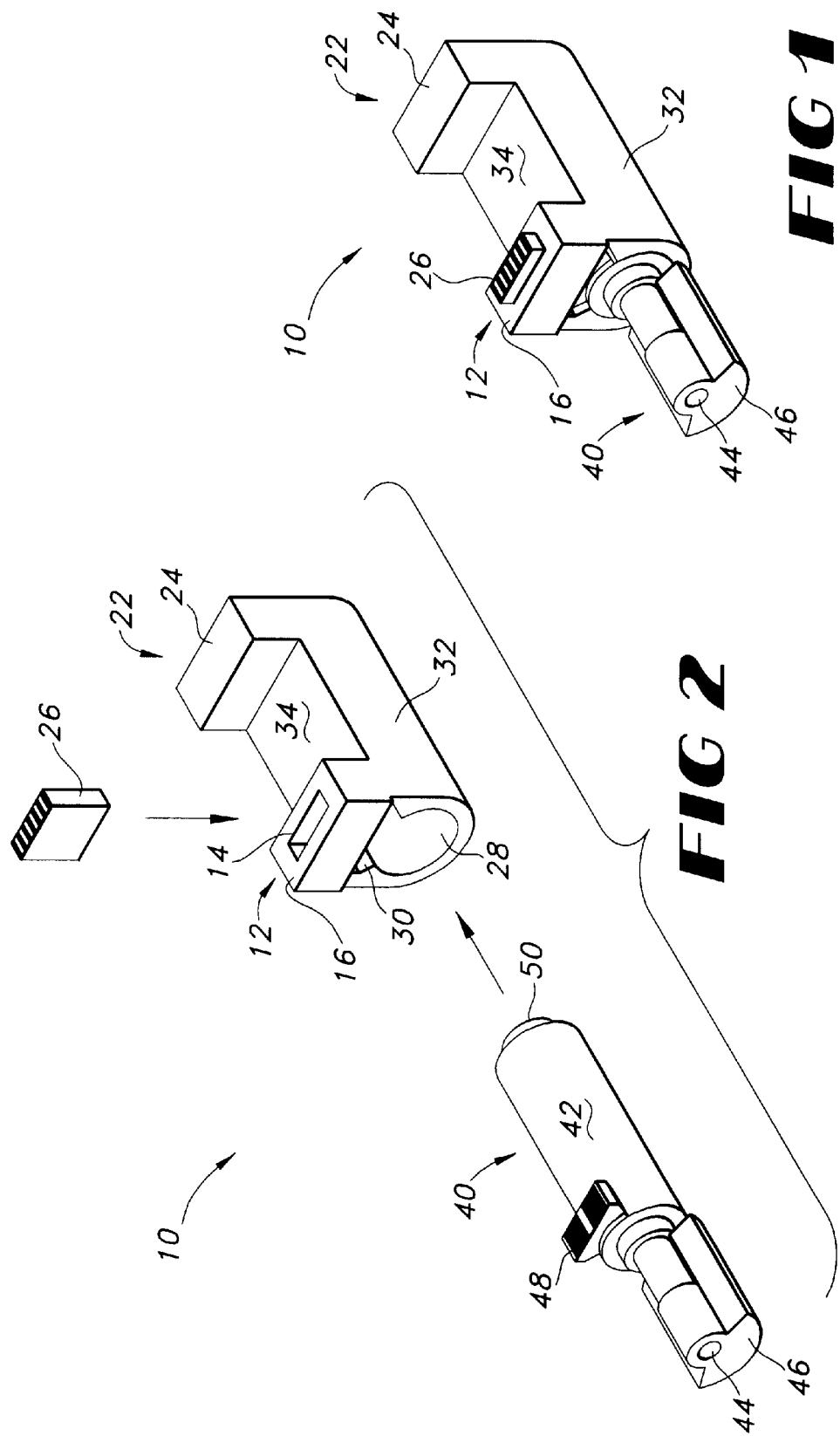

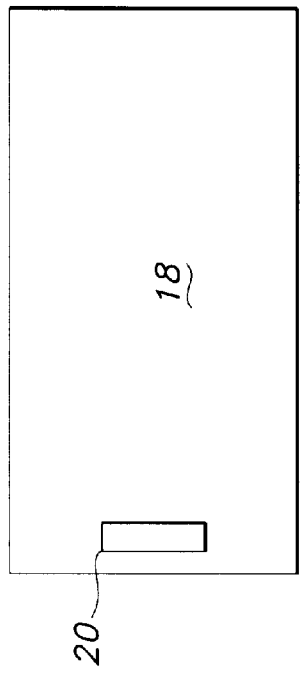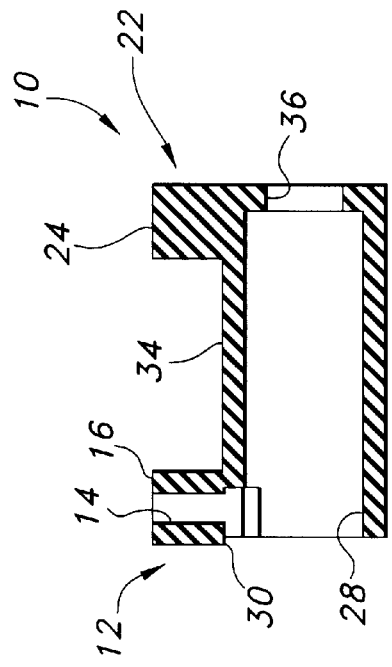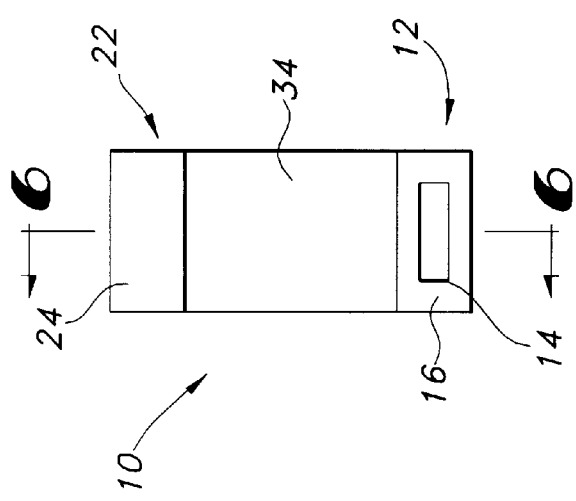

MOTOR BOOT FOR A CIRCUIT BOARD

FIELD OF THE INVENTION

In general, the present invention relates to motor boots and, in particular, the present invention relates to a motor boot for mechanically and electrically connecting a motor to a circuit board.

BACKGROUND

Typical motor boots and the associated motors take a great number of steps to install, which usually consist of the following. First, a motor is fitted with a boot. Second, motor lead wires are soldered to a Printed Circuit Board (PCB) for electrical operation of the motor. Next, the boot and motor are mounted in an electronic device, such as a mobile phone or pager. This type of motor boot is difficult to install, labor intensive during installation, and makes a large "footprint" on the circuit board, thereby taking up precious space within the electronic device. In addition, the connection method of these motor boots are soldered to the PCB thereby causing difficult rework procedures in manufacturing.

SUMMARY OF THE INVENTION

The present invention eliminates the above difficulties and disadvantages by providing a motor boot for mechanically and electrically connecting a motor to a circuit board that has an electrical contact with the motor having an electrical pad and a nob, disposed thereon. The motor boot includes a vibrational damping housing constructed of elastomeric material. The housing is U-shaped and includes a first support leg with a slot disposed therein. A second support leg is spaced apart from the first support leg, and a base is integrally formed with the first and second support legs.

The motor boot further includes a substantially cylindrical receptacle that is formed in the housing for slidably receiving and releasably securing the motor therein by interference fit. The receptacle includes a cut-out in fluid flow communication with the slot for receiving the electrical pad of the motor therein, and a port for receiving the nob of the motor therein.

The motor boot also includes a vibrational damping, electrically conductive, connector disposed in the slot that contacts the electrical pad of the motor and the contact when the motor boot is connected to the circuit board. This creates electrical communication between the motor and circuit board. The connector is constructed of an electrically conductive elastomeric material, absorbs mechanical energy of the motor, and transfers electrical energy of the motor to the circuit board. During installation, the motor boot is preferably connected to the circuit board by compression being applied to the housing by a wall of the device.

In one embodiment, the connector is integrally formed with the housing thereby making the motor boot of one piece construction. In yet another embodiment, the connector is slidably received and releasably secured within the slot by interference fit.

BRIEF DESCRIPTION OF THE DRAWINGS

FIG. 1 is a perspective view of a motor boot of the present invention and associated motor.

FIG. 2 is an exploded view of the motor boot of the present invention and associated motor.

FIG. 3 is a plan view of a circuit board.

FIG. 4 is a side elevational view of the motor boot of the present invention.

FIG. 5 is a plan view of the motor boot of the present invention.

FIG. 6 is cross sectional view of the motor boot of the present invention taken along sight line A—A of FIG. 5.

DETAILED DESCRIPTION OF THE PREFERRED EMBODIMENT(S)

The above and other features, aspects, and advantages of the present invention will now be discussed in the following detailed description and appended claims, which are to be considered in conjunction with the accompanying drawings in which identical reference characters designate like elements throughout the views. Shown in FIG. 1 is a motor boot 10 for mechanically and electrically connecting a motor 40 to a circuit board 18.

The motor boot 10 of the present invention is preferably constructed of SANTOPRENE 101-55, having a 55 shore A durometer of hardness and manufactured by Advanced Elastomer Systems of the United States; SANTOPRENE 101-45 having a 45 shore A durometer of hardness and manufactured by Advanced Elastomer Systems of the United States; LIM 6050, having a 55 Shore A durometer of hardness and manufactured by General Electric Company of the United States; LIM 6061, having a 60 Shore A durometer of hardness and manufactured by General Electric Company of the United States; or LIM 6071, having a 70 Shore A durometer of hardness and manufactured by General Electric Company of the United States. It is understood, however, that the motor boot 10 could also be constructed of other non-electrically conductive elastomers such as silicon rubber and that the above list is exemplary rather than limiting.

As shown in FIG. 3, the motor 40 has a surface mounted, electrical pad 48 disposed thereon for receiving an electrical signal for operation of the motor 40, a cylinder 42 that contains inductive windings of the motor 40, and a nob 50 disposed at one end of the cylinder 42. The motor 40 is preferably manufactured by the Namiki Company of Japan and further includes a rotating shaft 44 that extends outward from the cylinder 42 and a counter weight 46 secured to the shaft 44. Common mobile devices in which the circuit board 18, boot 10, and motor 40 are typically installed in, but that are not limited to, are pagers, mobile telephones, and other electronic devices.

The motor boot 10 further includes a vibrational damping housing, as shown in FIGS. 1, 2, 4, 5, and 6, which is constructed of the elastomeric material as described above. The housing is U-shaped 32 and includes a first support leg 12 with a contact 20 surface 16 and a slot 14 disposed therein. A second support leg 22 is spaced apart from the first support leg 12 and includes a brace surface 24. The first and second legs support the boot 10 as it is compression fit against the circuit board 18. A base 34 is integrally formed between and spaces apart the first and second support legs.

Formed in the housing is a receptacle 28 as shown in FIG. 2 and 6 for slidably receiving and releasably securing the motor 40 therein by interference fit, allowing for the motor 40 to be easily installed and uninstalled in the boot 10. The receptacle is preferably cylindrical in shape to receive the cylinder 42 of the motor 40 but could also be other configurations, such as rectangular or conical, depending upon the shape of the motor 40. The receptacle includes a cut-out 30 that is in fluid flow communication with the slot 14 for receiving the electrical pad 48 of the motor 40 therein, and a port 36 for receiving the nob 50 of the motor 40 when the cylinder 42 is inserted into the receptacle. As is best shown in FIGS. 4 and 6, the receptacle longitudinally extends through the housing.

A connector 26, as shown in FIGS. 1 and 2, is disposed in the slot 14 and contacts the electrical pad 48 of the motor 40 and the contact 20 when the motor boot 10 is connected to the circuit board 18, thereby creating electrical communication between the motor 40 and circuit board 18. In another embodiment of the present invention, the connector 26 is slidably received and releasbly secured within the slot by interference fit. Therefore, just as the motor 40 is easily inserted into and removed from the receptacle because of the interference fit, so to is the connector 26 easily inserted into and removed from the slot 14 in this embodiment. The interference fit of the connector 26 allows for it to be easily replaced in a manufacturing setting, or in the field, if a connector 26 of differing height is needed for varying clearances within different devices in which the boot 10 is installed. This interchangeability prevents the entire motor boot 10 from being discarded when the boot 10 is used in a different device. The connector 26 is constructed of an electrically conductive elastomeric material, which is preferably a STAX elastomeric connector manufactured by Thomas & Betts Corporation of Memphis, Tenn. Because the connector 26 is elastomeric, it provides for absorption of mechanical energy emitted by the motor 40 such as vibrational damping and the transfer of electrical energy from, or to, the circuit board 18.

During installation of the motor boot 10 in the device, the motor boot 10 is connected to the circuit board 18 by compression force being applied to the housing by a wall of the device such that the connector 26 abuts the contact 20. In particular, the brace surface 24 of the second support leg 22 is preferably compressed against the circuit board 18 as the integrally formed housing is compressed by a wall of the device. Moreover, the connector 26 abuts and is compressed against the contact 20 of the circuit board 18 thereby allowing electrical signals to pass through the connector 26 between the circuit board 18 and motor 40. Because the present connector 26 is an electrically conductive elastomer, the connector 26 will compress when the housing is compressed into the device such that the contact surface 16 of the first support leg 12 will come in contact with the circuit board 18 thereby giving the motor boot 10 a low height profile in the device.

In one embodiment of the present invention, the connector 26 is integrally formed with the housing thereby making the motor boot 10 of one piece construction. This is easily accomplished in the present invention because both the housing and connector 26 are constructed of an elastomeric material. During manufacturing of the housing, the slot 14 is doped with the electrically conductive elastomeric material that makes up the connector 26 as described above. Alternatively, an elastomeric adhesive can be placed in the slot 14 such that the connector 26 becomes chemically bonded to the elastomeric material of the housing. It is possible to insert mold the connector into the boot, therefore eliminating the need for adhesive.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above description is to be considered exemplary, rather than limiting, and the true scope of the invention is that defined in the following claims.

What is claimed is:

1. A motor boot for mechanically and electrically connecting a motor to a circuit board having an electrical contact and the motor having an electrical pad and a nob, disposed thereon, the motor boot comprising:
   a elongated vibrational damping housing constructed of elastomeric material, U-shaped, and including a first support leg with a slot disposed therein, a second support leg spaced apart from the first support leg, and a base integrally formed with the first and second support legs;
   a substantially enclosed cylindrical receptacle formed in the housing for slidably receiving and releasably securing the motor therein by interference fit, the receptacle including a cut-out in fluid flow communication with the slot for receiving the electrical pad of the motor therein, and a port for receiving the nob of the motor therein;
   a vibrational damping connector releasably disposed in the slot and contacting the electrical pad of the motor and the contact when the motor boot is connected to the circuit board, thereby creating electrical communication between the motor and circuit board, the connector being constructed of an electrically conductive elastomeric material; and
   wherein the motor boot is connected to the circuit board by compression force being applied to the housing such that the connector abuts the contact.

2. The motor boot of claim 1 wherein the connector is integrally formed with the housing thereby making the motor boot of one piece construction.

3. The motor boot of claim 1 wherein the connector is slidably received and releasably secured within the slot by interference fit.

4. A motor boot for mechanically and electrically connecting a motor to a circuit board having an electrical contact and said motor having an electrical pad disposed thereon, said motor boot comprising:
   an elongated substantially enclosed housing having an open ended receptacle for insertably and releasably receiving said motor therein;
   said housing further including a slot having a first connector insertion end and a second end in communication with said receptacle, said received motor having said electrical pad placed adjacent to said second end of said slot;
   a connector insertably accommodated within said first end of said slot so as to place said connector into electrical engagement with said electrical pad of said received motor at said second end of said slot and to permit compressive connection to said circuit board at said first end of said slot.

5. The motor boot of claim 4 wherein the connector is constructed of an electrically conductive elastomeric material.

6. The motor boot of claim 4 wherein both the housing and connector are constructed of an elastomeric material for damping vibration of the motor.

7. The motor boot of claim 4 wherein the connector is disposed in the housing via use of an adhesive.

8. The motor boot of claim 4 wherein the motor boot is connected to the circuit board by compression force being applied to the housing such that the connector abuts the contact.

9. The motor boot of claim 4 wherein the connector is integrally formed with the housing thereby making the motor boot of one piece construction.

10. The motor boot of claim 9 wherein the connector is constructed of an electrically conductive elastomeric material.

11. A motor boot for mechanically and electrically connecting a motor to a circuit board having an electrical contact and said motor having an electrical pad disposed thereon, said motor boot comprising:

an elongated substantially enclosed vibrational damping housing having an open ended receptacle for insertably and releasably receiving said motor therein;

said housing further including a slot having a first connector insertion end and a second end in communication with said receptacle, said received motor having said electrical pad placed adjacent to said second end of said slot;

a connector insertably accommodated within said first end of said slot so as to place said connector into electrical engagement with said electrical pad of said received motor at said second end of said slot, and to permit compressive connection to said circuit board at said first end of said slot, said connector insert being constructed of an electrically conductive elastomeric material.

12. The motor boot of claim 11 wherein both the housing and connector are constructed of an elastomeric material for damping vibration of the motor.

13. The motor boot of claim 11 wherein the connector is integrally formed with the housing thereby making the motor boot of one piece construction.

14. The motor boot of claim 11 wherein the connector is disposed in the housing via use of an adhesive.

15. The motor boot of claim 11 wherein the motor boot is connected to the circuit board by compression force being applied to the housing such that the connector abuts the contact.

* * * * *